United States Patent [19]  
Celler et al.

[11] Patent Number: 4,461,670  
[45] Date of Patent: Jul. 24, 1984

[54] PROCESS FOR PRODUCING SILICON DEVICES

[75] Inventors: George K. Celler, New Providence, N.J.; David J. Lischner, Salisbury, Pa.; McDonald Robinson, Chester, N.J.

[73] Assignee: AT&T Bell Laboratories, Murray Hill, N.J.

[21] Appl. No.: 374,309

[22] Filed: May 3, 1982

[51] Int. Cl.³ ............................................. C30B 1/08
[52] U.S. Cl. ........................... 156/603; 156/617 R; 156/DIG. 64; 156/DIG. 73; 156/DIG. 88; 148/175; 427/53.1
[58] Field of Search .................. 156/603, 617 R, 620, 156/624, DIG. 64, DIG. 73, DIG. 88, 111, 86; 427/93, 95, 53.1; 148/1.5, 175

[56] References Cited

U.S. PATENT DOCUMENTS 3,993,533 11/1976 Milnes et al. .................... 427/74  
4,068,814 1/1978 Anthony et al. .................. 156/620  
4,174,217 11/1979 Flately ............................. 427/93  
4,184,065 1/1980 Nagashina ....................... 156/620  
4,227,970 10/1980 Howell, Jr. et al. ............. 202/234  
4,371,421 2/1983 Fan et al. ...................... 156/DIG. 88

FOREIGN PATENT DOCUMENTS 56-126914 10/1981 Japan ......................... 156/DIG. 88

Primary Examiner—David L. Lacey  
Attorney, Agent, or Firm—Bruce S. Schneider

[57] ABSTRACT

Dielectrically isolated regions of single crystal silicon are produced through the use of a specific melting process. In this process, a substrate having regions of single crystal silicon contacting regions of non-single crystal silicon that overlie a dielectric material are treated. In particular, the entire region(s) of non-single crystal silicon is melted utilizing primarily radiant energy. Cooling is then initiated and the molten silicon is converted into a region of single crystal material. Isolation is completed by removing the appropriate regions of single crystal silicon.

9 Claims, 9 Drawing Figures

FIG. 1
FIG. 1A
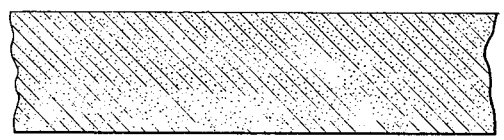
FIG. 1B
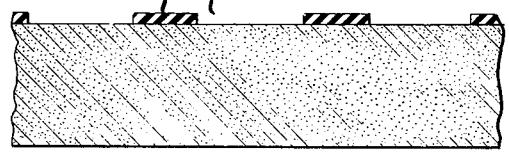
FIG. 1C
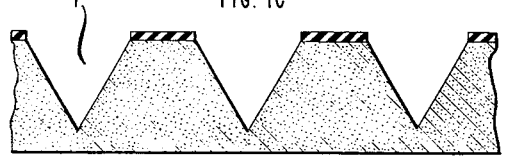
FIG. 1D
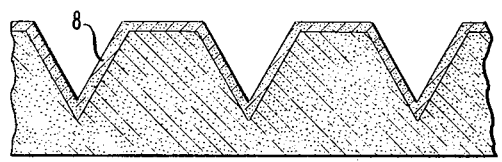
FIG. 1E
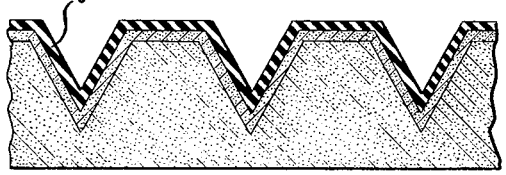
FIG. 1F
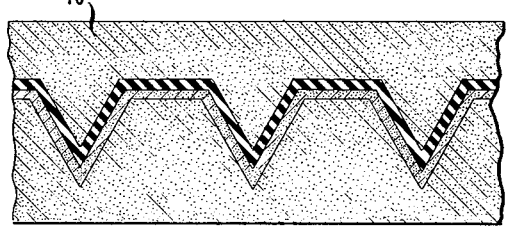
FIG. 1G

PROCESS FOR PRODUCING SILICON DEVICES

BACKGROUND OF THE INVENTION

1. Field of the Invention

This invention relates to semiconductor devices and, in particular, to dielectrically isolated semiconductors.

2. Art Background

In most electronic components, such as integrated circuits, electrical isolation is produced between regions of essentially single crystal silicon by junction isolation. (Single crystal silicon is silicon having defects, e.g., linear and planar defects such as dislocations or stacking faults, respectively, in a density through the crystal of less than $10^8$ defects per $cm^{+2}$.) In this junction approach, lateral isolation is accomplished by interposing between the active single crystal silicon regions, a region of opposite electrical type from that of the active region. The thickness of this added region is approximately equal to the depth of the active regions of the single crystal materials being separated. Similarly, vertical isolation in the junction approach is obtained by the presence of material of opposite conductivity type positioned below the active region. (The active region is that portion of the single crystal silicon which is ultimately modified to contain electronic device structures. The active region is typically 1 $\mu$m thick for nominal voltage devices.) Such rectifying junctions formed at the boundaries of the active regions of opposite type provide lateral and vertical isolation when appropriately biased. For some applications lateral junction isolation is replaced with lateral dielectric isolation to save space and to reduce capacitance. (Lateral dielectric isolation entails the presence of an insulator rather than a material of opposite conductivity type at the lateral boundaries of the active region.) By expedients such as junction isolation or lateral dielectric isolation, transistors or other devices formed in one single crystal region, i.e., one active region, are electrically isolated and are prevented from interacting with devices in a second active region.

However, for some significant applications the use of junction isolation, or a combination of junction and lateral dielectric isolation, is not sufficient. For example, in some instances, the voltage employed in operation is often large enough to cause electrical breakdown between separate active regions. This electrical breakdown occurs through many paths such as by the penetration of charge carriers below one active region through the underlying substrate, across the substrate under the lateral isolation region, and into the second active region. When a typical junction isolation structure is employed, the voltages encountered in some applications, such as telephone line interface circuits, are sufficient to cause breakdown by charge carrier penetration through the isolating regions. To prevent such undesirable electrical interaction between two active regions, a combination of lateral and vertical dielectric isolation is employed. This dielectric isolation is provided by surrounding the single crystal silicon regions with an electrically insulating dielectric material. By this expedient, interaction between active regions even at high voltages is avoided.

Vertical dielectric isolation is also advantageously used in devices operating at nominal voltages where enhanced reliability is desirable. The additional insulating material that provides the vertical dielectric isolation also prevents electron-hole pairs, formed in the underlying substrate by thermal processes or by ionizing radiation, from migrating to an active region and, therefore, introducing errors in the processing of information by the electronic devices in this region. Additional advantages are also available by replacing junction isolation completely with dielectric isolation. Typical junction isolation introduces significant capacitance into the structure. It is possible in theory to increase the insulating capability of junction isolation to prevent breakdown in high-voltage devices. However, a high-voltage application requires a correspondingly high resistivity in the junction isolation region. Since the size of the depletion region increases with both voltage and resistivity, enhanced breakdown characteristics require an extremely large volume devoted to isolation. This large volume imposes a penalty both in the required volume per device and in increased parasitic capacitance. The substitution of dielectric isolation for junction isolation greatly reduces the area requirement, thereby reducing cost and also reduces capacitance, allowing faster device operation.

A variety of processes have been employed to produce semiconductor components having dielectric isolation. The majority of these processes have been directed to producing a thin, i.e., less than 3 microns, dielectrically isolated active region. In a number of these processes directed to producing thin active regions, a precursor structure is fabricated by first forming patterned regions of dielectric material, e.g., silicon oxide, on a single crystal silicon substrate. Silicon is deposited onto this structure which results in non-single crystal material, e.g., amorphous or polycrystalline silicon, overlying the dielectric regions and contacting the substrate portions exposed between these regions. The non-single crystal silicon is then treated to cause growth of single crystal silicon at the non-single crystal silicon/substrate interface and to propagate this single crystal through the non-single crystal silicon region. This propagation is done by melting a discrete zone containing both the single crystalline and non-single crystal material and then propagating this discrete zone through the non-single crystal region in a manner akin to a zone refining process.

One method has been disclosed for producing a thick, i.e., 3 $\mu$m or thicker, dielectrically isolated active region. This process has been described by K. E. Bean and W. R. Runyan, *Journal of the Electrochemical Society*, 124, 50 (1977). The Bean process, possibly because of the desire to produce thick, dielectrically isolated single crystal silicon, does not involve a melting procedure which propagates a nucleated crystal through the polycrystalline region by translating a discrete molten zone. Instead, an elaborate series of deposition and etching steps, as shown in FIG. 1, is utilized. Briefly, the steps involve the treatment of a high-quality single crystal substrate. This silicon substrate, 1A in FIG. 1, is coated with an insulating material, such as silicon oxide, 3, and holes, 5, are formed in the oxide by conventional techniques, e.g., photolithography and oxide etching. Grooves, 7, are then anisotropically etched in the exposed portions of the silicon underlying the holes in the dielectric material. The masking oxide is removed and the entire surface is epitaxially coated with an optional layer of N+ silicon, 8. The N+ silicon is, in turn, coated with an insulator, 9, such as silicon oxide. The insulator is once again, in turn, coated with a layer of polysilicon, 10. The structure produced is denoted 1F in FIG. 1.

The entire structure is then inverted and the silicon substrate is ground off and polished until the structure shown at 1G is obtained. In this structure, the remaining high-quality silicon is denoted by 12 and 15, the insulating layer is indicated by 14, and polysilicon is indicated by 16. Thus, the final structure has single crystal silicon, 12 and 15, on an electrically insulating material.

As can be appreciated from the previous description and from FIG. 1, dielectric isolation of thick silicon active regions involves a multitude of complicated processing steps. Additionally, the extensive processing employed introduces high levels of defects into the single crystal active regions and results in low yields of useful devices. Thus, components involving thick, dielectrically isolated regions of silicon have only been used for applications which require production of devices where properties are critical and expense is a secondary factor.

SUMMARY OF THE INVENTION

Dielectrically isolated thick regions of single crystal silicon are produced by a relatively uncomplicated procedure. A melting procedure is employed resulting in good yields of relatively low-defect dielectrically isolated single crystal silicon. Further, the heating process does not require melt source propagation across the non-crystalline silicon region and thus results in more rapid production of thick, dielectrically isolated active regions than is presently achievable even in the production of thin dielectrically isolated active regions. In the inventive procedure, a precursor structure having single crystal silicon regions in intimate contact with thick non-single crystal silicon regions is utilized. The thick non-single crystal silicon regions overlie a dielectric material such as a layer of silicon oxide. The precursor structure is typically capped with a layer of material that is sufficiently thick to confine the molten silicon during subsequent heating steps. For example, a capping layer of silicon oxide is employed. The precursor structure is heated utilizing a heat source providing heat by predominantly, i.e., more than 50 percent, preferably more than 80 percent, radiant transfer to entirely melt the regions of non-single crystalline silicon. (The capping layer prevents the balling of the underlying molten silicon—preventing the agglomeration of silicon and thus preserving spatial uniformity). A temperature gradient is provided between the top and the bottom surface of the precursor structure to ensure that the entire structure is not melted. The level of radiant heat supplied to the precursor structure is then reduced so that recrystallization of the molten zone occurs. The temperature gradient that is present between the surface of the molten silicon and the surface of the precursor structure farthest removed from the molten silicon causes recrystallization to initiate at the single crystal/molten zone interface. Surprisingly, this thermal gradient is sufficient to produce solidification into single crystal material throughout the formerly non-single crystal silicon region without the necessity of affirmatively propagating a heat source across the non-single crystal region. Isolation is completed by, for example, etching away the single crystal seeding, i.e., nucleating regions. The process is reliable, is relatively rapid and is considerably simpler than the procedure previously used for the production of thick dielectrically isolated single crystal silicon active regions. Moreover, the single crystal, dielectrically isolated regions produced by this method have greatly reduced defect densities compared with those produced by conventional dielectric isolation processing.

BRIEF DESCRIPTION OF THE DRAWINGS

FIGS. 1A–1G are illustrative of a technique disclosed in the literature for producing thick dielectrically isolated silicon active regions.

DETAILED DESCRIPTION

Figure 2:
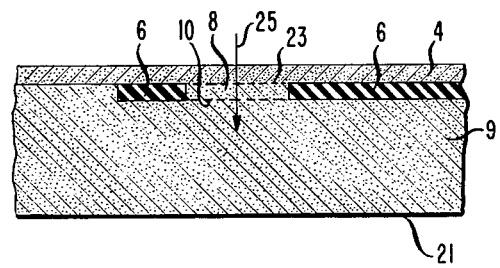
FIGS. 2 and 3 are illustrative of aspects involved in the inventive technique.

The inventive process is practiced on a precursor structure, such as shown in FIG. 2, which has region(s) of non-single crystal silicon, e.g., polycrystalline silicon or amorphous silicon, 4, that at least in part overlie a region(s), 6, of dielectric material, e.g., silicon oxide, and that typically contacts a region or region(s), 8 or 9 of single crystal silicon. The production of such precursor structures are described in co-assigned U.S. application Ser. No. 231,238 (H. J. Leamy 12) filed Feb. 4, 1981, which is hereby incorporated by reference and in co-assigned and co-pending application Ser. No. 374,308 filed simultaneously with this application which is also hereby incorporated by reference. Generally, the regions of dielectric material, e.g., silicon oxide, have a thickness in the range 0.5 to 10 $\mu$m. Thinner regions typically do not yield an advantageous level of dielectric isolation while thicker regions require a relatively long-growth period and thus are uneconomical.

Figure 3:
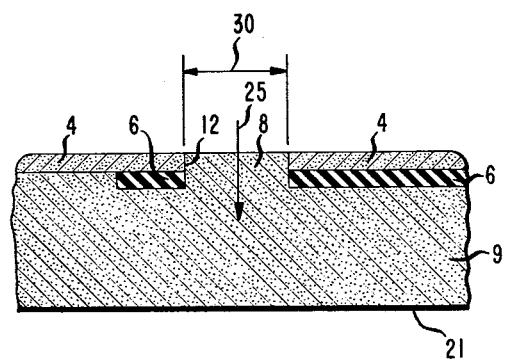

In a typical method for producing the desired precursor structure, the dielectric material is formed on a single crystal silicon substrate and patterned to yield the desired region of dielectric material. Silicon is then generally deposited onto the single crystal substrate with its regions of dielectric material. The deposition is continued for the production of thick active regions until the non-single crystalline silicon overlying the dielectric material has a thickness of at least 3 microns. In this manner, structures such as shown in FIG. 2 are produced, where 9 is a single crystalline substrate, where region(s) 4 is a non-single crystalline region, and where region(s) 8 (delimited by imaginary dotted lines) is either a single crystalline or non-single crystal region. (If region 8 in FIG. 2 is non-crystalline, generally a depression above this region occurs at the surface of the non-crystalline region, 4.) Additionally, depending on the method of fabrication of the precursor structure, it is possible, as shown in FIG. 3, that the single crystal region 8 has its exposed surface of extent, 30, either above or below the surface of the non-single crystalline region, 4. The relative spatial relationship of the surface of the single crystal silicon region to the surface of the non-single crystal silicon region is not critical provided there is intimate contact between the two. For example, there is intimate contact between the two regions at 10 as shown in FIG. 2, when region 8 is non-crystalline, at 23 if region 8 is single crystalline or at 12 in FIG. 3 where region, 8, is single crystal silicon.

The regions of non-single crystalline silicon in the precursor structure are completely melted during processing. There is a tendency for these melted regions to ball. To prevent unacceptable balling, it is generally desirable to cap the non-single crystal silicon with a layer of a material which does not adversely interact with the underlying silicon. (If a portion of single crystal material is also to be melted, it is also desirable that this portion be capped). The capping layer is formed of a material which melts or significantly softens at a temperature significantly higher, e.g., 300 degrees C. higher, than the melting point of silicon. (The melting of the capping layer is not precluded, however, provided it still confines the underlying silicon and does not mix or chemically interact with it.) When the underlying non-single crystal silicon is melted, the capping layer remains continuous over the molten mass, confines it, and prevents balling. Typically, a capping layer thickness in the range 0.1 to 5 μm is desirable. Generally, thicker layers are not acceptable since they take an excessive time to form while thinner layers are typically too weak to sustain the stress produced by the thermal treatment. The material employed for the capping region should not adversely interact with the underlying regions of silicon, e.g., there should not be an unacceptable chemical reaction between the silicon and the capping material. There also should not be sufficiently large stress between materials to produce significant cracking of the capping layer or other physical degradation upon thermal processing. For example, the use of a bilayer capping material with a bottom layer of silicon oxide and an upper layer of silicon nitride, although not precluded, has shown a tendency to crack and should generally not be used unless cracking is prevented.

Generally, a capping body such as a single layer of silicon oxide is quite acceptable for capping the non-single crystal silicon regions. The capping body as discussed serves one primary purpose, i.e., to prevent balling of the underlying molten silicon. However, if the molten silicon layer is quite thick, such unacceptable balling is prevented due to the confinement provided by the viscosity of the silicon material. Thus, the capping layer is not an essential element of the invention but merely an expedient to allow suitable melting under certain conditions.

Once the precursor structure is formed (together with a capping body when desired), the non-single crystal region(s) of silicon are melted by supplying predominately radiant rather than convective or conductive heat. For example, black-body radiation is employed to heat the precursor structure. It is desirable that the radiation be absorbed primarily near the surface of the precursor structure, i.e., in and near the capping material (if present) and non-single crystal material. Because of the properties of silicon, this requisite is inherently satisfied for typical sources of radiant energy. In particular, as silicon gets hotter its absorption coefficient for radiation in the range 0.5 to 30 μm becomes significantly larger. (Below 0.5 μm the absorption coefficient of silicon is very high irrespective of temperature.) Thus, as the precursor body is heated most of the incident radiation is absorbed within a short distance of the non-single crystal silicon surface. The use of a capping layer which strongly absorbs the radiant energy, although not essential, also contributes to limiting the depth of penetration of the radiation. Thus, for example, it is possible to employ a capping layer that strongly absorbs the incident radiant energy and causes melting of the underlying non-single crystal silicon material by conduction. (The requirement that heating be accomplished primarily by radiant heating relates to the heating of the precursor structure. The means of heat transfer within the precursor structure including a capping layer (if present) to produce melting of the non-single crystal silicon regions is not critical.)

Heating is continued until all of the polycrystalline silicon regions that are to be converted to single crystal silicon regions have been completely melted. Although it is not essential that any portion of any region of single crystal silicon be melted, such melting is not precluded. In this regard, generally the entire substrate upon which the precursor structure is built is a single crystal silicon material. The regions of single crystal silicon in contact with the non-single crystal silicon regions are typically an extension of this substrate. Thus, provided the entire substrate is not melted, which obviously should be avoided, there will be areas of single crystal silicon in contact with the melted regions of silicon. As a result, the extent of melting beyond that required to melt the regions of non-single crystal silicon is not critical. (It is possible that during fabrication an extremely thin layer of silicon oxide is inadvertently grown and is interposed between the single crystal silicon region and the non-single crystal silicon region. This layer presents no problem since it dissolves in molten silicon. Thus, it is removed when the molten silicon contacts it. However, to ensure complete removal, it is desirable that at least a small amount of single crystal silicon adjoining it also be melted.)

It is, however, generally desirable to limit heating after the melting of the non-single crystal regions so that deformations across a dielectric region are not greater than 20 percent of the average thickness of the final isolated single crystal region. Generally, for capping materials such as silicon oxide the use of a resistively heated source of radiation such as tungsten halogen lamp, or an arc lamp providing an intensity at the capping region in the range of 60 to 100 W/cm$^{+2}$ is appropriate. Typically, such a source will melt a 5 to 20 μm thick non-single crystal silicon region underlying a 0.5 to 3 μm thick $SiO_2$ capping region in 1 to 100 seconds. Continued heating after this melting has been accomplished, as discussed above, is not precluded and in fact advantageous results are obtained even when melting continues to a level of 0 to 20 μm below the surface of the dielectric regions.

After the desired degree of melting has been achieved, cooling is initiated in a manner that ensures that the temperature of the top surface, e.g., the capping layer, is greater than the temperature of the furthest removed surface, i.e., the bottom surface, 21, in FIGS. 2 and 3, to ensure a temperature gradient is established in direction 25. This temperature differential should be sustained until recrystallization is substantially complete. This criterion is satisfied in a variety of ways. For example, the radiant heating is terminated slowly so that the surface of the molten silicon also cools relatively slowly. For example, when a radiant light source is employed that is resistively heated, e.g., a tungsten halogen lamp, termination is accomplished by reducing the current from the level used to melt the non-single crystal silicon regions to essentially no supplied current over a suitable period of time. Typically, time periods of 60 seconds produce advantageous results. However, significantly shorter time periods such as 10 seconds and as low as 2 seconds are also quite useful.

Additionally, to ensure the appropriate temperature gradient during melting and recrystallization, it is desirable that a non-reflecting means be provided so that radiation from the heat source or from the bottom of the wafer is not reflected to the single crystalline substrate surface, 21, in FIGS. 2 and 3 during heating. For example, an absorbing body, such as a black aluminum plate or a transmissive body, such as a quartz sheet is placed under the substrate. The non-reflecting means should be sufficiently larger than the precursor structure that light incident below the substrate is not reflected onto it. It is also desirable that the means used to prevent reflection does not itself radiate a substantial amount of energy. For example, it is appropriate to cool, e.g., water-cool, an absorbing non-reflective means so that absorbed energy is not substantially reradiated. Assuming that reflection is substantially avoided, the ambient surrounding the substrate is not critical.

Although an air, inert gas, or vacuum ambient is perfectly acceptable, certain advantages are attainable utilizing an oxygen ambient. In particular, when a silicon oxide capping layer is employed the oxygen tends to heal any cracks in this material. Additionally, any silicon sublimed from other surfaces is passivated by a silicon oxide layer formed through reaction with the oxygen. Isolation is completed by removing, for example by etching, the small region of single crystal material between regions of silicon that overlie the dielectric. Devices are formed in the single crystal active regions through well-known conventional techniques.

Through the use of the inventive process non-single crystal silicon regions having lateral dimensions of up to 2 mm × 1 mm are converted into single crystal regions overlying a dielectric material such as silicon oxide. Indeed, it appears that 2 mm × 1 mm regions are by no means a limit to the useful size of dielectrically isolated single crystal silicon which is producible. The following example are illustrative of suitable conditions employed to achieve such results.

EXAMPLE 1

A polished silicon wafer 3 inches in diameter having its major surface in the {100} plane was purchased from a commercial supplier. A cleaning solution was prepared by mixing 12.24 kg of concentrated sulfuric acid with 1000 ml of 30 percent hydrogen peroxide. The solution was heated to 100 degrees C. and the wafer was immersed for approximately 10 minutes. The wafer was transferred to a deionized water bath that was heated to 70 degrees C. The water in the bath was exchanged three times and then the wafer was dried by spinning. The wafer was introduced into a furnace heated to 1150 degrees C. The atmosphere of the furnace was produced by bubbling oxygen through a water bubbler heated to 98 degrees C. and introducing the oxygen which was thus saturated with water vapor into the furnace. The treatment of the wafer with oxygen was continued for 6.5 hours to produce a 2 micron thick silicon oxide layer. A 1 micron thick layer of AZ 111 positive resist (a proprietary product of Shipley Company) was spun onto the silicon oxide layer. The resist was exposed with a mercury lamp through a mask which contacted the resist surface. The mask pattern consisted of a series of opaque rectangles of varying sizes which were separated by approximately 50 micron-wide spaces. The resist was then developed in a commercial resist developer. The exposed oxide regions were then etched away by immersing the wafer in a buffered aqueous solution of HF for 30 minutes. The resist was then removed by utilizing a commercial resist stripper, and the wafer was again cleaned utilizing the previously described hydrogen peroxide/sulfuric acid treatment with the associated rinse and drying steps.

The wafer was transferred to the sample holder of an AMV-1200 CVD reactor (sold by Applied Materials, Inc.). The wafer was positioned so that the silicon oxide surface was exposed. The system was purged with dry nitrogen and then with dry hydrogen. The wafers were heated to 1150 degrees C. in dry hydrogen. The hydrogen flow was adjusted to give a flow rate of 95 liters per minute. A flow of 4 g per minute of silicon tetrachloride was introduced into the reactor for 1 minute. The use of this 1 minute treatment resulted in the deposition between the rectangular silicon oxide regions of 1.4 microns of epitaxial silicon onto the exposed regions of single crystal silicon. After the silicon tetrachloride was terminated, the substrate temperature was reduced to 1050 degrees C. and a silane flow of 150 sccm for 46 minutes was introduced. After the 46 minute flow, the introduction of silane was terminated. This procecure resulted in approximately 15 microns of polycrystalline silicon overlying the silicon oxide rectangles and an approximately equal thickness of epitaxial silicon overlying the previously deposited epitaxial silicon. The deposition chamber was purged with dry hydrogen for 1 minute, the heating was terminated, and the wafer was allowed to cool in the dry halogen atmosphere.

The surface of the polycrystalline material was cleaned, rinsed and dried by the previously described procedure. A silicon dioxide capping layer was deposited by the low-pressure chemical vapor deposition process described in R. S. Rosler, *Solid State Technology*, pp. 63–70, April 1977. In this procedure the substrate was heated to approximately 430 degrees C. The total pressure of silane and oxygen introduced into the apparatus was approximately 0.5 Torr. The flow rates of silane, oxygen and nitrogen were, respectively, 60 sccm, 520 sccm and 1500 sccm. The deposition of this silicon dioxide capping layer continued for approximately 182 minutes to produce a layer thickness of approximately 2 microns.

The wafer was then transferred to the sample holder of a radiant heat furnace. This furnace consisted of two chambers separated from each other and sealed off by quartz plates. Each wafer was positioned on three quartz pins in the lower chamber, about 0.5 inches above a water-cooled blackened aluminum oven floor. The upper chamber contained a bank of tungsten-halogen lamps suspended below a gold plated reflector. Both chambers had lateral dimensions of 10 × 12.5 inches. To avoid lamp overheating and early failure, air is forced through the fully enclosed upper chamber, which is essentially a wind tunnel with a quartz lower wall. Three phase-angle fired power supplies controlled by a microprocessor provide in excess of 100 kW to the lamps, which is sufficient to melt silicon. After the wafer was inserted with the capping layer facing the lamps the furnace was closed, the air cooling of the lamps begun and the water cooling of the oven floor initiated. An oxygen flow was introduced into the sample chamber of the furnace to provide an atmosphere of oxygen around the wafer. The power to the lamps was linearly increased over a period of 10 seconds from 0 to 112 kW. The use of 112 kW of electrical power provided 78 W/cm$^2$ of radiant energy at the capping surface of the precursor structure. The 112 kW power level was continued for 20 seconds. The lamp current was then linearly decreased to zero over a time period of 60 seconds. By this procedure the polycrystalline material overlying the silicon dioxide dielectric was entirely converted to single crystal silicon. The silicon dioxide capping layer was removed by immersing the wafer in a buffered HF aqueous solution for approximately 30 minutes.

What is claimed is:

1. A process for producing an active region of single crystal silicon overlying a region of dielectric material comprising the steps of:
   (1) forming a precursor structure that includes a region of non-single crystal silicon material which both overlies said region of dielectric material and which is in proximity to a nucleating region of single crystal silicon and
   (2) converting said non-single crystal silicon region into said active region of single crystal silicon by employing said nucleating region of single crystal silicon as a nucleating site characterized in that said conversion is accomplished by entirely melting at least said region of non-single crystal silicon with heat at least 50 percent of which is provided from a radiant source to form a molten silicon region which contacts said nucleating region and allowing said molten silicon region to recrystallize while maintaining the surface of said molten region at a higher temperature than the temperature of the surface of said precursor structure furthest vertically removed from said surface of said molten region.

2. The process of claim 1 wherein said radiant source comprises a resistively heated lamp.

3. The process of claim 2 wherein said resistively heated lamp comprises a tungsten halogen lamp.

4. The process of claim 1 wherein said radiant source comprises an arc lamp.

5. The process of claim 1 wherein said region of dielectric material comprises silicon oxide.

6. The process of claim 1 wherein a capping layer overlies said region of non-single crystal silicon.

7. The process of claim 5 wherein said capping region comprises silicon oxide.

8. The process of claim 1 wherein a means is provided to substantially prevent energy from being reflected onto said furthest removed surface of said precursor body.

9. The process of claim 8 wherein said means comprises a blackened aluminum plate.

* * * * *